(12) United States Patent
Kondou (10) Patent No.: US 7,233,452 B2
(45) Date of Patent: Jun. 19, 2007

(54) METHOD OF VERIFYING PREAMPLIFIER CIRCUIT FUNCTIONS, AND MAGNETIC RECORD REGENERATION APPARATUS USING THE SAME

(75) Inventor: Masao Kondou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 145 days.

(21) Appl. No.: 11/186,823

(22) Filed: Jul. 22, 2005

(65) Prior Publication Data

US 2006/0215293 A1    Sep. 28, 2006

(30) Foreign Application Priority Data

Mar. 25, 2005    (JP)    ............... 2005-089657

(51) Int. Cl.
G11B 27/36    (2006.01)
G11B 5/09    (2006.01)

(52) U.S. Cl. .......................................... 360/31; 360/46
(58) Field of Classification Search ..................... None
See application file for complete search history.

(56) References Cited

U.S. PATENT DOCUMENTS 4,203,137 A * 5/1980 Beck et al. ................... 360/31
4,634,704 A   1/1987 Janssens et al.
6,101,052 A * 8/2000 Gooding et al. ............... 360/46
6,952,316 B2 * 10/2005 Tretter ......................... 360/31

FOREIGN PATENT DOCUMENTS

| JP | 61-10577 | 1/1986 |
| JP | 5-41041 | 2/1993 |
| JP | 05266441 A * | 10/1993 |
| JP | 11-16129 | 1/1999 |
| JP | 2003-157501 | 5/2003 |

* cited by examiner

Primary Examiner—Tan Dinh
Assistant Examiner—Dan I Davidson
(74) Attorney, Agent, or Firm—Armstrong, Kratz, Quintos, Hanson & Brooks, LLP (57) ABSTRACT

Disclosed is a preamplifier circuit of a magnetic record regeneration apparatus with a write system and a read system, certainly verifying a write function in a short period of time. The preamplifier circuit includes, in the write system, a write driver; a current-voltage conversion circuit for converting the write current from the write driver into a corresponding voltage; a waveform shaping circuit for converting the output voltage from the current-voltage conversion circuit into a full-wave rectified waveform; a peak-hold circuit for holding a peak value of the output from the waveform shaping circuit; a filter circuit for outputting an average voltage of the output from the waveform shaping circuit; and a determination circuit for determining that the write driver is abnormal based on each output status of the peak-hold circuit and the filter circuit.

11 Claims, 7 Drawing Sheets

FIG. 3I 
NORMAL ABNORMAL ABNORMAL NORMAL

METHOD OF VERIFYING PREAMPLIFIER CIRCUIT FUNCTIONS, AND MAGNETIC RECORD REGENERATION APPARATUS USING THE SAME

CROSS-REFERENCE TO RELATED APPLICATIONS

This application is based upon and claims the benefit of priority from the prior Japanese Patent Application No. 2005-89657, filed on Mar. 25, 2005, the entire contents of which are incorporated herein by reference.

BACKGROUND OF THE INVENTION

1. Field of the Invention

The present invention relates generally to a magnetic record regeneration apparatus and, more particularly, to a method of verifying whether writing (write) and readout (read) functions of a preamplifier circuit operate properly or not, and to a magnetic record regeneration apparatus using the method.

2. Description of the Related Art

Recently, along with sophistication of information processing, ensuring credibility of data is becoming an important element. Especially, in magnetic record regeneration apparatus, the most important function is to verify whether data has been able to be recorded on a recording medium or not.

In fact, when writing, data are recorded onto the recording medium by write currents inverted along with inversion of write data, passing through a magnetic head. A detection circuit in a preamplifier circuit can detect disconnection in circuit wiring of a system for writing and disconnection on the head side.

In other words, as verification means of the write system, the own error detection function of the preamplifier can determine defects of other than the preamplifier (such as defective connections).

However, for failures of the preamplifier itself, for example, output current values, verification means does not exist until now and, therefore, it is problematic that functional decline cannot be detected if write currents is reduced by damages of circuit parts due to ESD (electrostatic destruction) of the preamplifier circuit.

For example, as a characteristic of write currents, in order to perform writing sufficiently, a rising portion of a waveform has an overshoot. Therefore, if the write current is reduced such that this overshoot cannot be obtained due to ESD (electrostatic destruction), this reduction can not be detected.

Therefore, conventionally, by providing verification (verifying readout) processing after write operation, the write operation is guaranteed. As a method of the guarantee, some propositions have been made. For example, in Japanese Patent Application Laid-Open Publication No. 1993-41041, a method is described for deciding whether data are correctly written into a recording medium or not by comparing the write data with the read data.

Also, in Japanese Patent Application Laid-Open Publication No. 1999-16129, a method is described for comparing and deciding read waveforms.

Further, in Japanese Patent Application Laid-Open Publication No. 1993-41041, a method is described for knowing failures beforehand by deliberately deteriorating a read signal processing system for failure prediction.

Further, in Japanese Patent Application Laid-Open Publication No. 1986-10577, a method is disclosed for banning writing beforehand if Write-unsafe is detected when writing is performed in an idle state.

However, all of these methods decrease own access performances of apparatuses and are unrealistic methods which are hardly used.

Further, although Japanese Patent Application Laid-Open Publication No. 2003-15751 discloses an invention for verifying a function of a head amplifier for readout in a magnetic head, descriptions are not made for verifying a write function, i.e., verifying whether data is recorded into the recording medium or not, which is most important function, in first place.

SUMMARY OF THE INVENTION

Thus, in consideration of the problems of inventions in above conventional propositions, the object of the present invention is to provide a method of certainly verifying a write function in a short period of time, as a function verification method of a preamplifier circuit, and to provide a magnetic record regeneration apparatus using this method.

In addition to the above method of verifying the write function, the present invention provides a method of verifying a read function, as a function verification method of a preamplifier circuit, and provides a magnetic record regeneration apparatus using this method.

Therefore, the feature of the present invention is to accurately monitor write currents by directly connecting final output of write current output to a dummy load to confirm normality of current waveforms.

In order to achieve the above object, according to a first aspect of the present invention there is provided a preamplifier circuit of a magnetic record regeneration apparatus with a write system which sends write currents corresponding to write data to a magnetic head performing writing and readout of data into and from a recording medium and a read system which receives readout currents of the magnetic head, comprising, in the write system, a write driver; a current-voltage conversion circuit for converting the write current from the write driver into a corresponding voltage; a waveform shaping circuit for converting the output voltage from the current-voltage conversion circuit into a full-wave rectified waveform; a peak-hold circuit for holding a peak value of the output from the waveform shaping circuit; a filter circuit for outputting an average voltage of the output from the waveform shaping circuit; and a determination circuit for determining that the write driver is abnormal based on each output status of the peak-hold circuit and the filter circuit.

Preferably, the determination circuit determines that the write driver is abnormal when an AND logic does not approved between the outputs of the peak-hold circuit and the filter circuit. Preferably, the determination circuit has first comparative detection means for outputting an error if the output of the peak-hold circuit deviates from a range relative to a first reference voltage, and second comparative detection means for outputting an error if the average voltage output of the filter circuit deviates from a range relative to a second reference voltage, and it is preferably determined that the write driver is abnormal when either the first comparative detection means or the second comparative detection means output an error. The preamplifier circuit of a magnetic record regeneration apparatus may further comprise a changeover switch provided on the input side of the write driver; means for converting the write data into an analog signal and returning the write data to the read system when the changeover switch prevents the write data from being input to the write driver; and a determination circuit for determining whether the read system is normal or abnormal from the returned analog signal, the determination circuit comprising: a circuit for obtaining an envelope curve of the returned analog signal; and a comparison circuit for comparing the level of the obtained envelope curve with a predetermined reference value, wherein it is determined from the comparison in the comparison circuit that the read system is abnormal when the level of the envelope curve is smaller than the reference value.

To attain the above object, according to a second aspect of the present invention there is provided a magnetic record regeneration apparatus, comprising a magnetic head for performing writing and readout of data into and from a recording medium; and a preamplifier circuit with a write system which sends write currents corresponding to write data to the magnetic head and a read system which receives readout currents of the magnetic head, the preamplifier circuit comprising, in the write system, a write driver; a current-voltage conversion circuit for converting the write current from the write driver into a corresponding voltage; a waveform shaping circuit for converting the output voltage from the current-voltage conversion circuit into a full-wave rectified waveform; a peak-hold circuit for holding a peak value of the output from the waveform shaping circuit; a filter circuit for outputting an average voltage of the output from the waveform shaping circuit; and a determination circuit for determining that the write driver is abnormal based on each output status of the peak-hold circuit and the filter circuit.

In order to achieve the above object, according to a third aspect of the present invention there is provided a method of verifying normality of a preamplifier circuit in a magnetic record regeneration apparatus having a write system which sends write currents corresponding to write data to a magnetic head performing writing and readout of data into and from a recording medium and a read system which receives readout currents of the magnetic head, the method comprising the steps of converting the write current from the write driver in the write system into a corresponding voltage; converting the converted voltage into a full-wave rectified waveform; holding a peak value of the converted full-wave rectified waveform; outputting an average voltage of the converted full-wave rectified waveform; and determining that the write system is abnormal based on the peak value and the average voltage.

By using the present invention, one can certainly know reduction in peak currents and steady-state current values of write current wave forms due to performance deterioration of preamplifier circuits, in a short period of time.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENT

An embodiment of the present invention will now be described with reference to the drawings. The embodiment is intended for the purpose of understanding the present invention, and the technical scope of the present invention is not limited thereto.

Figure 1:
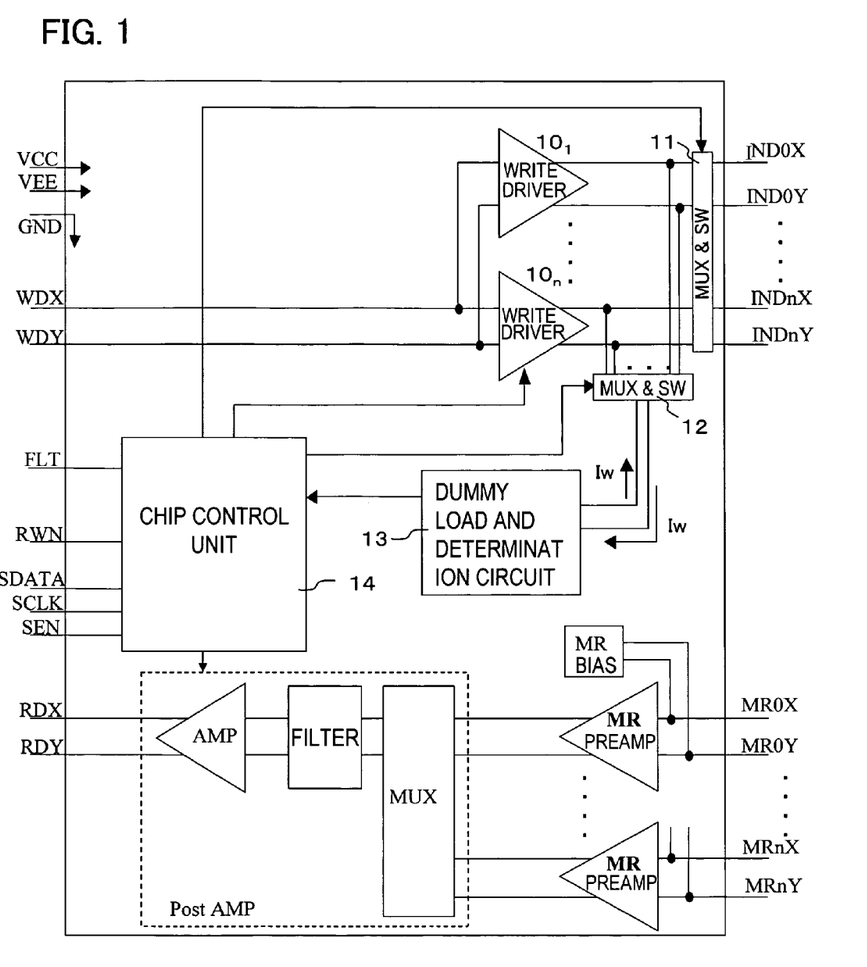
FIG. 1 is a preamplifier circuit of a magnetic record regeneration apparatus to which the present invention is applied.

FIG. 1 is a preamplifier circuit of a magnetic record regeneration apparatus to which the present invention is applied. In FIG. 1, the circuit has a plural number n of write drivers 101 to 10n, which are respectively connected through a multiplexer switch unit 11 to n magnetic heads (MR heads) not shown to supply write currents.

In order to apply the present invention, a multiplexer switch unit 12 and a dummy load and determination circuit unit 13 are added. The write drivers 101 to 10n and the multiplexer switch units 11 and 12 are controlled by a chip control unit 14.

In other words, the chip control unit 14 selects and activates or deactivates each of the write drivers 101 to 10n. When verifying the preamplifier circuit, output currents from the write driver selected from the write drivers 101 to 10n are output from the multiplexer switch unit 12 and are input into the dummy load and determination 13.

Figure 2:
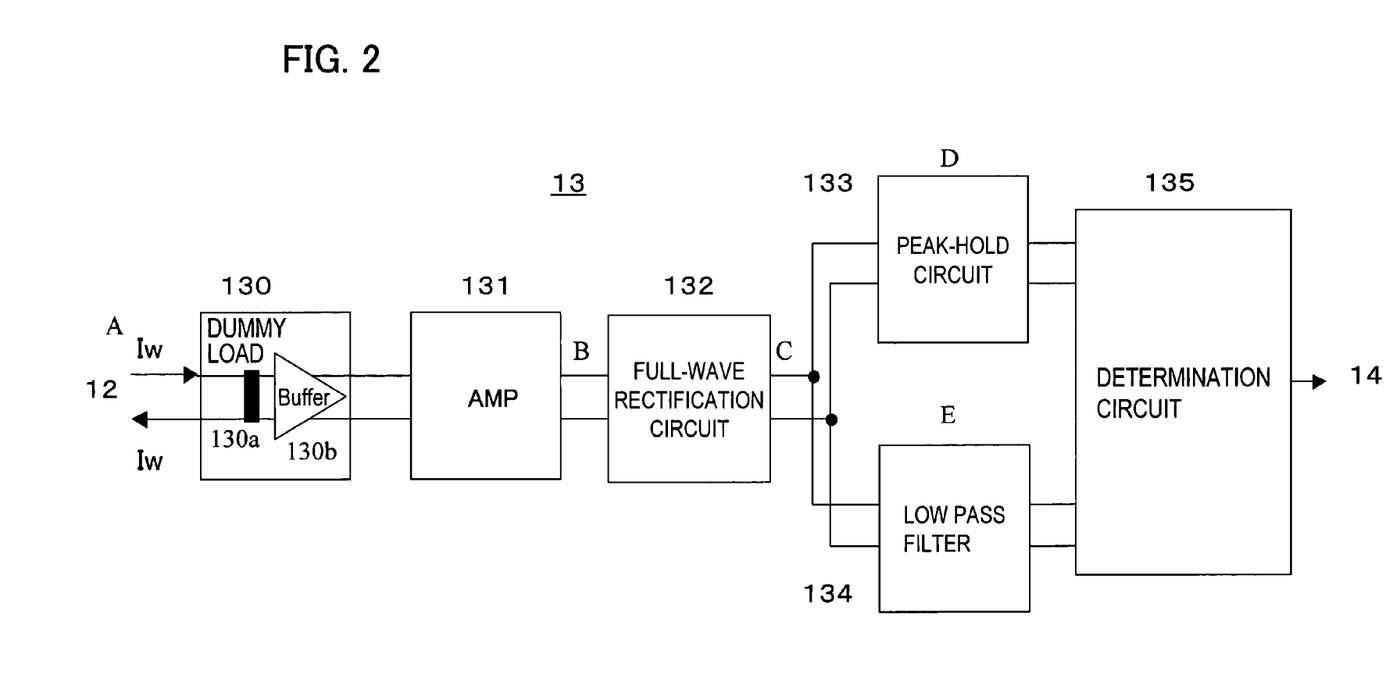
FIG. 2 is a diagram showing a structure example of the dummy load and determination circuit 13 of FIG. 1.

A structure example of the dummy load and determination circuit 13 is shown in FIG. 2. Further, FIGS. 3A to 3I are diagrams showing signals in each unit of the dummy load and determination circuit 13. FIG. 3A to FIG. 3E are waveforms at corresponding positions with alphabets of FIG. 2.

Figure 3A:
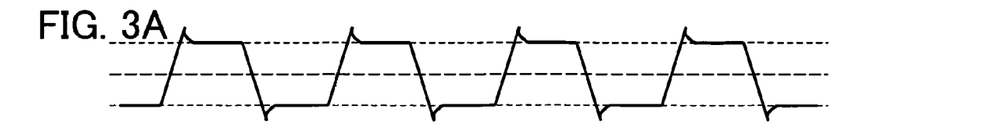
FIGS. 3A to 3I are diagrams showing signals in each unit of the dummy load and determination circuit 13.

When one (1) write driver 10*i* is selected, the write driver 10*i* outputs a test signal corresponding to a write signal shown in FIG. 3A.

At this point, the chip control unit 14 controls the multiplexer switch units 11 and 12 such that the test signal from the write driver 10*i* is returned within the preamplifier circuit. The test signal returned by the multiplexer switch unit 12 is input into the dummy load and determination circuit 13.

As shown in FIG. 2, the dummy load and determination circuit 13 has a dummy load 130 on the input side. The dummy load 130 is configured to have a parallel resistance 130*a* and a buffer amplifier 130*b*. At this point, impedance of the dummy load 130 has a resistance value equal to impedance of the magnetic head (MR head) (about 70Ω).

Figure 3B:
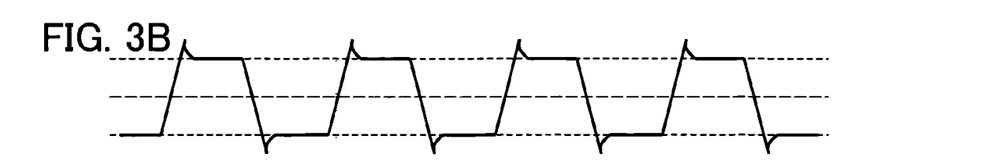
Figure 3C:
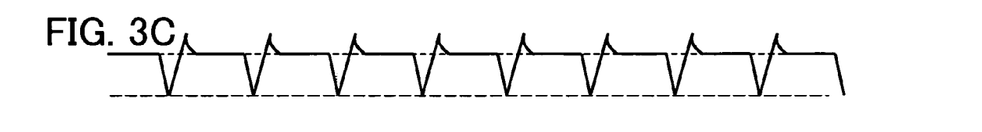
Figure 3D:
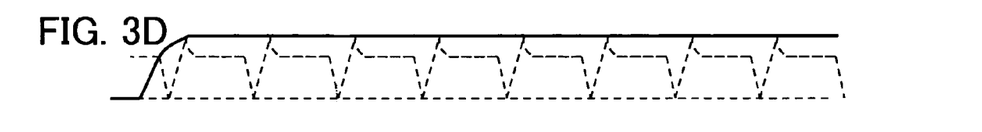
Figure 3E:
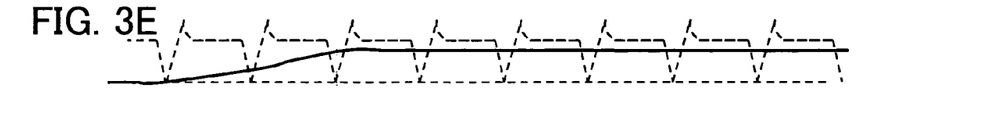
Figure 3F:
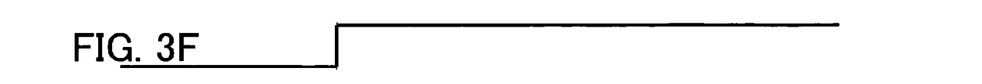

By this parallel resistance 130*a*, the test signal current (see FIG. 3A) is converted to a corresponding voltage and amplified by an amplifier 131 to a predefined level (see FIG. 3B). Then, full-wave rectification is performed by a full-wave rectification circuit 132 (see FIG. 3C).

The output of the full-wave rectification circuit 132 is supplied to a peak-hold circuit 133 and a low pass filter 134. The peak-hold circuit 133 holds an output peak value of the full-wave rectification circuit 132 (see FIG. 3D). On the other hand, the low pass filter 134 shapes the output from the full-wave rectification circuit 132 into a signal indicating an average value with high-frequency components of an overshoot portion removed (see FIG. 3E).

Then, outputs from the peak-hold circuit 133 and the low pass filter 134 are input into a determination circuit 135.

The determination circuit 135 determines normality of write operation of the preamplifier circuit based on the outputs from the peak-hold circuit 133 and the low pass filter 134. As one method of the determination, an AND logic of the outputs of the peak-hold circuit 133 and the low pass filter 134 is picked up, and if the AND logic is approved, a logic "1" signal is output, and it is determined that the write operation of the preamplifier circuit is normal (see FIG. 3F).

Figure 3G:
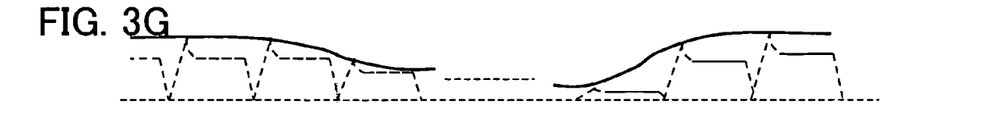
Figure 3H:
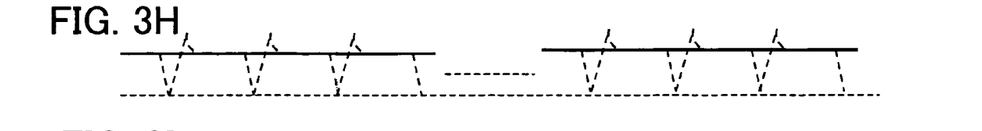
Figure 3I:
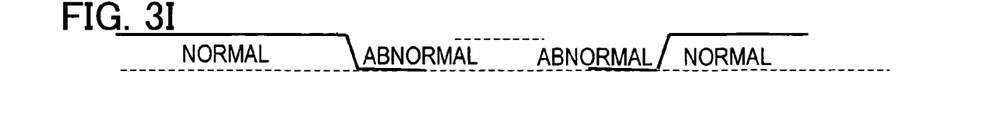

Further, FIG. 3G to FIG. 3I are diagrams showing cases that partial changes occur between a normal status and an abnormal status.

In first halves of FIG. 3G to FIG. 3I, since the output level of the peak-hold circuit 133 is reduced, the AND logic to the output of the low pass filter 134 is no longer approved, resulting in a change from the normal status to the abnormal status. On the other hand, in second halves of FIG. 3G to FIG. 3I, since the output level of the peak-hold circuit 133 is increased, the AND logic to the output of the low pass filter 134 makes the transition from the not-approved state to the approved state, and therefore, the abnormal status changes into the normal status.

In this way, if the AND logic cannot be picked up between the outputs of the peak-hold circuit 133 and the low pass filter 134, it means that a predetermined write current is not in a predetermined level range. In such a case, the determination circuit 13 sends an alert signal to the chip control unit 14. Then, the chip control unit 14 converts the corresponding write driver into an inactive state, performs processing for banning the write operation, for example, and at the same time, displays to the user accordingly.

In this way, inconveniences can be avoided, which occurs because, when performing readout of data, the data has not been stored since the data was deficiently written, for example.

Also, the method of the determination in the determination circuit 135 can be configured as follows.

The determination circuit 135 is provided with first comparative detection means for outputting an error if the output level of the peak-hold circuit 133 deviates from a range relative to a first reference voltage, and second comparative detection means for outputting an error if the average voltage output of the filter circuit deviates from a range relative to a second reference voltage.

When either the first comparative detection means or the second comparative detection means output an error, it is determined that the write driver is abnormal. By doing this way, the magnetic head can be supplied with write currents optimal for both the maximum value and the average value of the output of the write driver in the preamplifier circuit.

Figure 4:
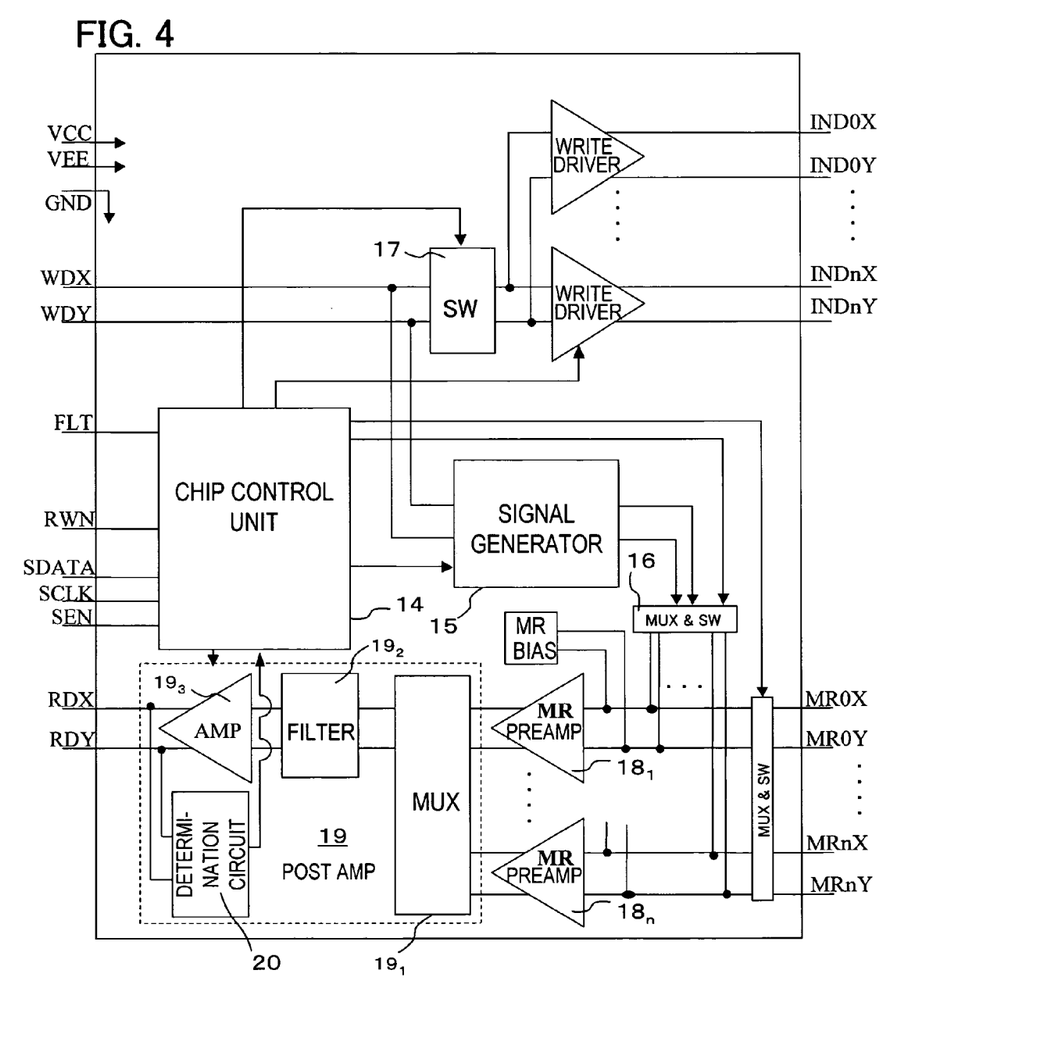
FIG. 4 is a block diagram of an embodiment of a preamplifier circuit according to the present invention, which is configured such that the operation verification of the preamplifier circuit is performed for a read system in addition to a write system.

FIG. 4 is a block diagram of an embodiment of a preamplifier circuit according to the present invention, which is configured such that the operation verification of the preamplifier circuit is performed for a read system in addition to a write system.

For the operation verification of the read system, a signal generator 15 and a multiplexer switch unit 16 are provided, and a determination circuit 20 is provided in a post amplifier unit 19. In FIG. 4, the additional function unit for verifying the write system operation shown in FIG. 1 is not shown.

Figure 5:
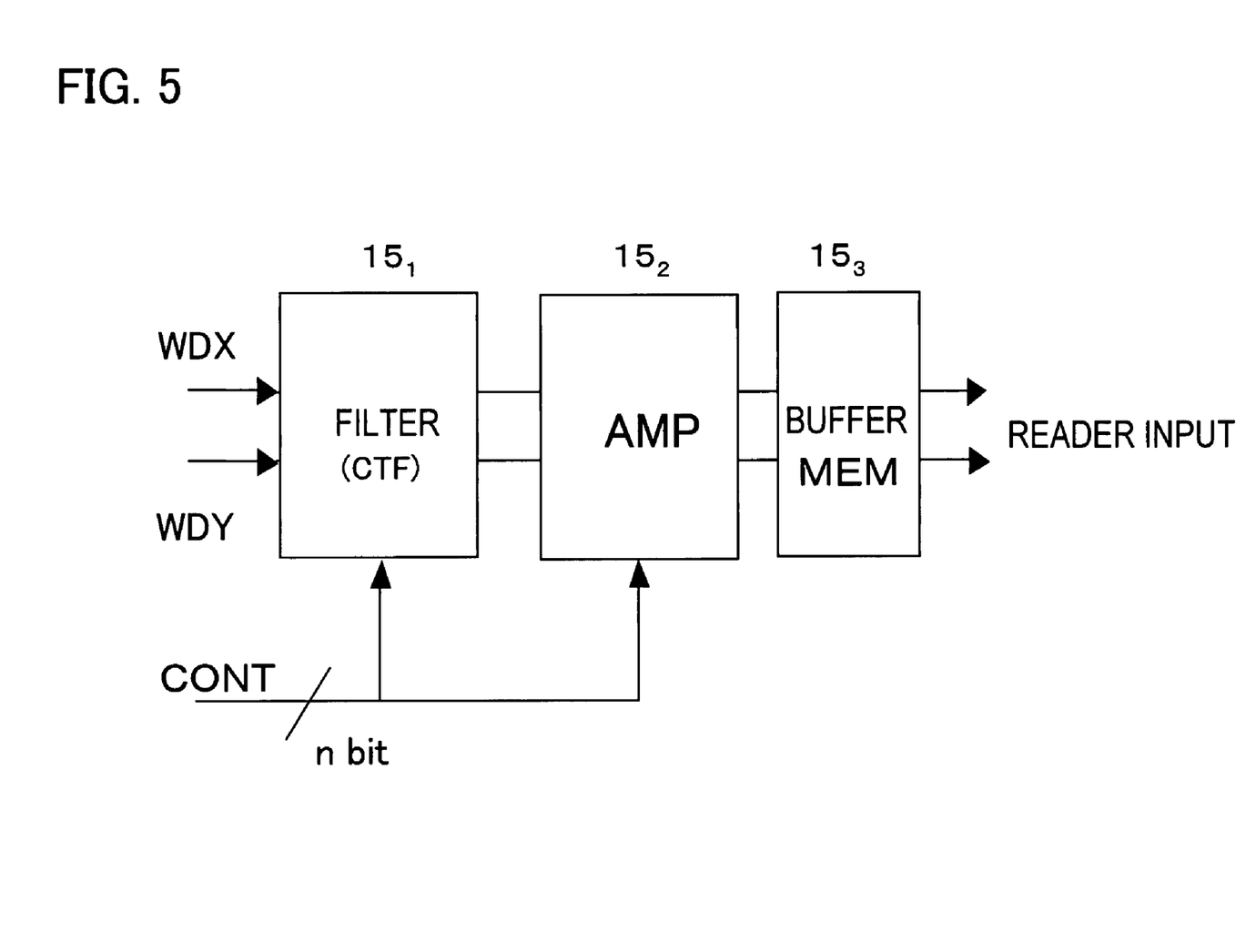
FIG. 5 is a diagram showing a specific example of a signal generator 15.

For FIG. 4, a specific example of the signal generator 15 is shown in FIG. 5.

At the time of the verification of the read system operation, a changeover switch 17 is controlled by the chip control unit 14 such that write data (WDX, WDY) are not directed to the write driver 10₁ to 10n and are input into the filter side 151 of the signal generator 15.

At this point, the signal generator 15 is activated by the chip control unit 14. Since the write data (WDX, WDY) input into a filter 151 of the signal generator 15 are rectangular waves as shown in FIG. 3A, the write data is output as a sine-wave output by removing high-frequency components with the low pass function of the filter 151. The output of the filter 151 is amplified by an amplifier 152 and output as a reader input. A buffer memory is provided for impedance matching with the multiplexer switch unit 16.

Such an output from the signal generator 15 is returned and guided to a multiplexing unit 191 through the multiplexer switch unit 16 selected and controlled by the chip control unit 14 and through a read amplifier selected from read amplifiers 18₁ to 18n corresponding to the channel.

The output of the multiplexing unit 191 is input into the determination circuit 20 through a filter 192 and an output amplifier 193.

Figure 6:
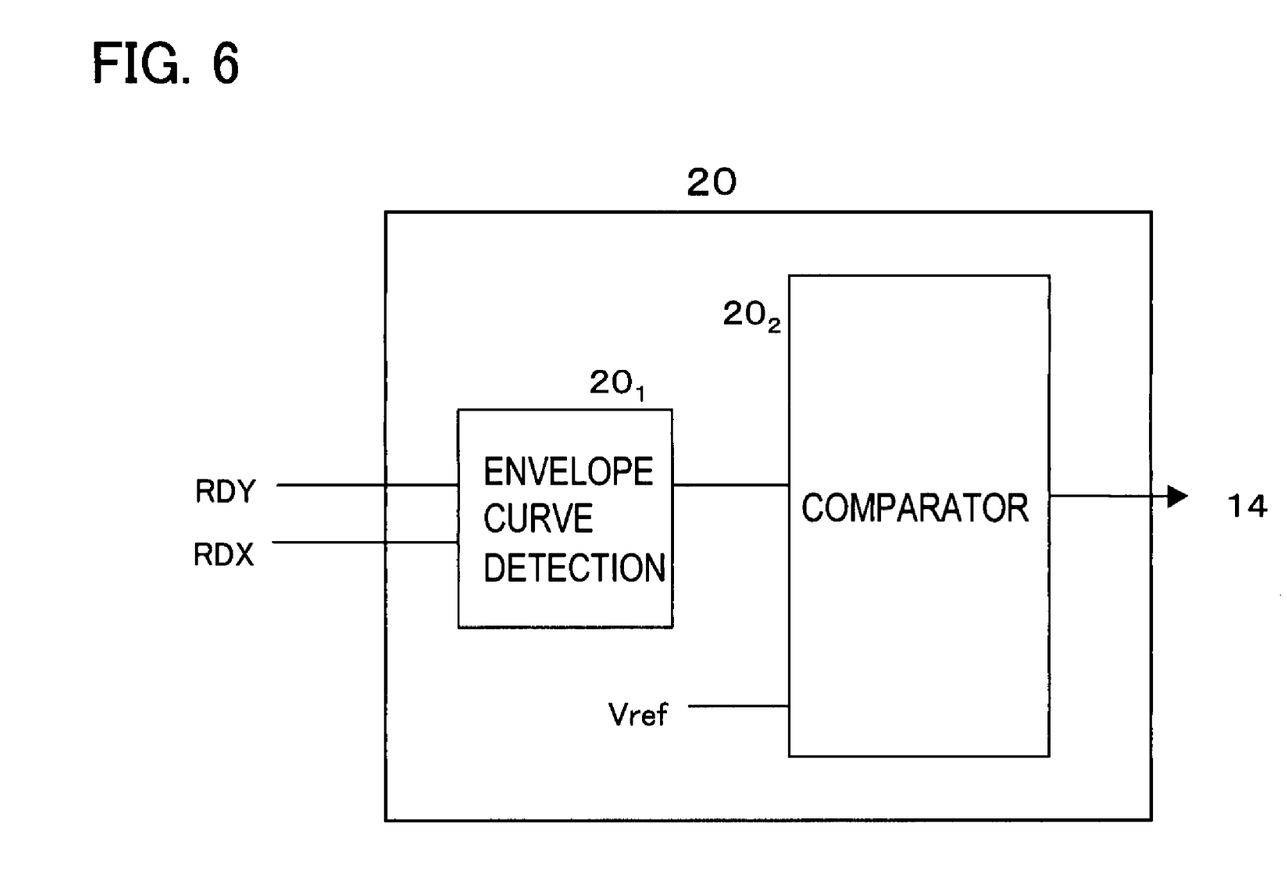
FIG. 6 is a diagram shows a structure example of a determination circuit 20.
Figure 7:
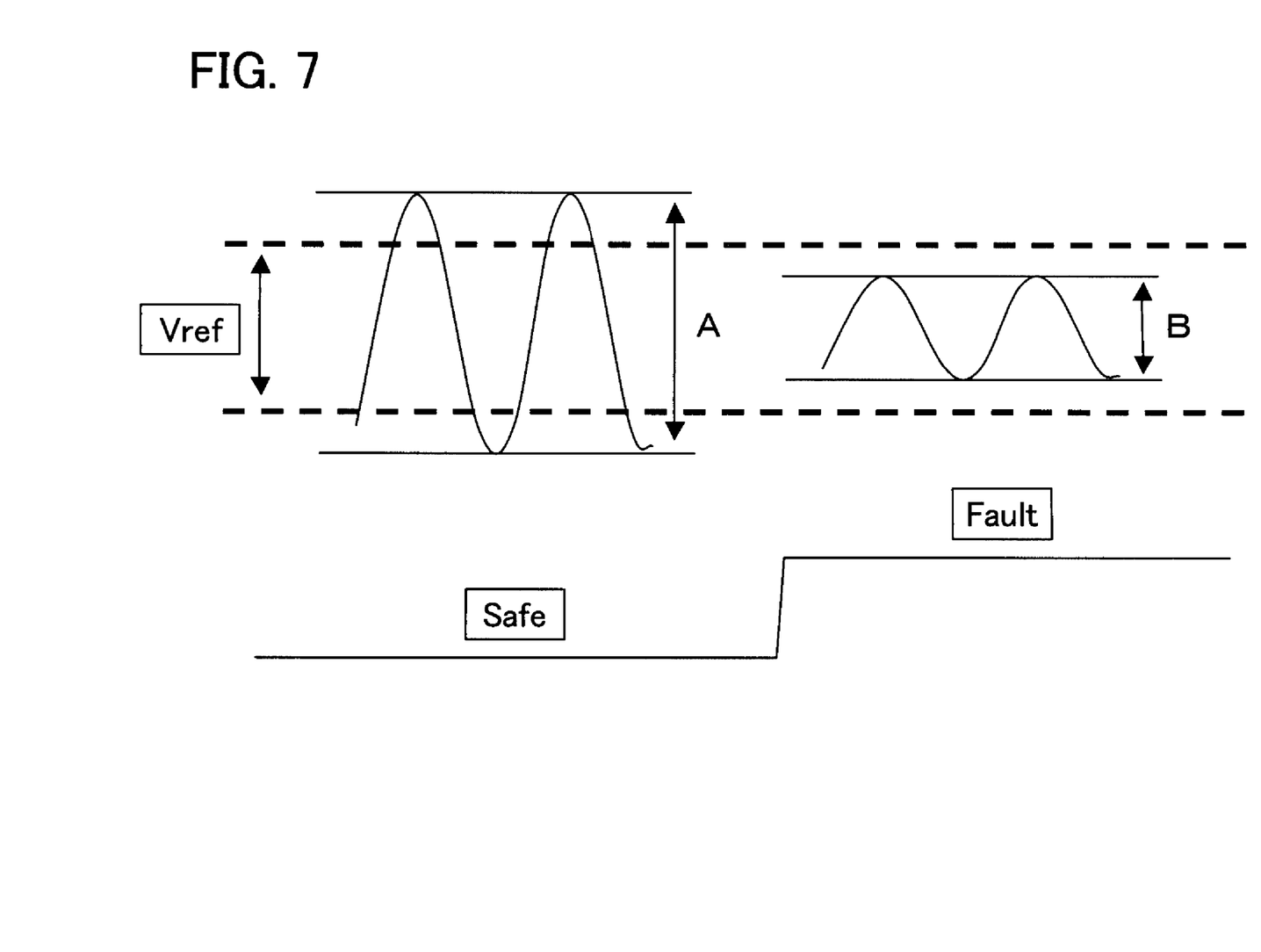
FIG. 7 is a diagram describing the determination operation of the determination circuit 20 of FIG. 6.

FIG. 6 shows a structure example of the determination circuit 20. The determination circuit 20 received the input. The determination circuit is configured to have an envelope curve detection unit 201 and comparator 202. As shown in FIG. 7, the envelope curve detection unit 201 obtains envelope amplitude of the output of the multiplexing unit 191 and the comparator 202 compares the obtained envelope amplitude with a reference level Vref.

Since the region of the envelope amplitude A exceeds the reference level Vref, it is determined that the read system operation is normal (Safe). On the other hand, since the region of the envelope amplitude B is smaller than the reference level Vref, it is decided that the read system operation is not operated normally in this case (Fault).

In this way, the information indicating that the operation is normal (Safe) or not operated normally (Fault) is determined by the determination circuit 20 and guided to the chip control unit 14 to give a predefined display to an operator.

As set forth hereinabove, the present invention provides a method of verifying a write performance and read function in a preamplifier circuit by returning write data within the preamplifier circuit and can detect whether a write system and a read system are normal or abnormal. Therefore, a credible magnetic record apparatus can be provided.

While the illustrative and presently preferred embodiment of the present invention has been described in detail herein, it is to be understood that the inventive concepts may be otherwise variously embodied and employed and that the appended claims are intended to be construed to include such variations except insofar as limited by the prior art.

What is claimed is:

1. A preamplifier circuit of a magnetic record regeneration apparatus with a write system which sends write currents corresponding to write data to a magnetic head performing writing and readout of data into and from a recording medium and a read system which receives readout currents of the magnetic head, comprising, in the write system:

a write driver;

a current-voltage conversion circuit for converting the write current from the write driver into a corresponding voltage;

a waveform shaping circuit for converting the output voltage from the current-voltage conversion circuit into a full-wave rectified waveform;

a peak-hold circuit for holding a peak value of the output from the waveform shaping circuit;

a filter circuit for outputting an average voltage of the output from the waveform shaping circuit; and a determination circuit for determining that the write driver is abnormal based on each output status of the peak-hold circuit and the filter circuit.

2. The preamplifier circuit of a magnetic record regeneration apparatus of claim 1, wherein the determination circuit determines that the write driver is abnormal when an AND logic does not approved between the outputs of the peak-hold circuit and the filter circuit.

3. The preamplifier circuit of a magnetic record regeneration apparatus of claim 1, wherein the determination circuit has first comparative detection means for outputting an error if the output of the peak-hold circuit deviates from a range relative to a first reference voltage, and second comparative detection means for outputting an error if the average voltage output of the filter circuit deviates from a range relative to a second reference voltage, and wherein it is determined that the write driver is abnormal when either the first comparative detection means or the second comparative detection means output an error.

4. The preamplifier circuit of a magnetic record regeneration apparatus of claim 1, further comprising:

a changeover switch provided on the input side of the write driver;

means for converting the write data into an analog signal and returning the write data to the read system when the changeover switch prevents the write data from being input to the write driver; and a determination circuit for determining whether the read system is normal or abnormal from the returned analog signal, the determination circuit comprising:

a circuit for obtaining an envelope curve of the returned analog signal; and a comparison circuit for comparing the level of the obtained envelope curve with a predetermined reference value, wherein it is determined from the comparison in the comparison circuit that the read system is abnormal when the level of the envelope curve is smaller than the reference value.

5. The preamplifier circuit of a magnetic record regeneration apparatus of claim 2, further comprising:

a changeover switch provided on the input side of the write driver;

means for converting the write data into an analog signal and returning the write data to the read system when the changeover switch prevents the write data from being input to the write driver; and a determination circuit for determining whether the read system is normal or abnormal from the returned analog signal, the determination circuit comprising:

a circuit for obtaining an envelope curve of the returned analog signal; and a comparison circuit for comparing the level of the obtained envelope curve with a predetermined reference value, wherein it is determined from the comparison in the comparison circuit that the read system is abnormal when the level of the envelope curve is smaller than the reference value.

6. The preamplifier circuit of a magnetic record regeneration apparatus of claim 3, further comprising:

a changeover switch provided on the input side of the write driver;

means for converting the write data into an analog signal and returning the write data to the read system when the changeover switch prevents the write data from being input to the write driver; and a determination circuit for determining whether the read system is normal or abnormal from the returned analog signal, the determination circuit comprising:

a circuit for obtaining an envelope curve of the returned analog signal; and a comparison circuit for comparing the level of the obtained envelope curve with a predetermined reference value, wherein it is determined from the comparison in the comparison circuit that the read system is abnormal when the level of the envelope curve is smaller than the reference value.

7. A magnetic record regeneration apparatus, comprising:

a magnetic head for performing writing and readout of data into and from a recording medium; and a preamplifier circuit with a write system which sends write currents corresponding to write data to the magnetic head and a read system which receives readout currents of the magnetic head, the preamplifier circuit comprising, in the write system:

a write driver;

a current-voltage conversion circuit for converting the write current from the write driver into a corresponding voltage;

a waveform shaping circuit for converting the output voltage from the current-voltage conversion circuit into a full-wave rectified waveform;

a peak-hold circuit for holding a peak value of the output from the waveform shaping circuit;

a filter circuit for outputting an average voltage of the output from the waveform shaping circuit; and a determination circuit for determining that the write driver is abnormal based on each output status of the peak-hold circuit and the filter circuit.

8. The magnetic record regeneration apparatus of claim 7, wherein the determination circuit determines that the write driver is abnormal when an AND logic does not approved between the outputs of the peak-hold circuit and the filter circuit.

9. The magnetic record regeneration apparatus of claim 7, wherein the determination circuit includes first comparative detection means for outputting an error if the output of the peak-hold circuit deviates from a range relative to a first reference voltage, and second comparative detection means for outputting an error if the average voltage output of the filter circuit deviates from a range relative to a second reference voltage, and wherein it is determined that the write driver is abnormal when either the first comparative detection means or the second comparative detection means output an error.

10. The magnetic record regeneration apparatus of claim 7, wherein the preamplifier is further comprised of:

a changeover switch provided on the input side of the write driver;

means for converting the write data into an analog signal and returning the write data to the read system when the changeover switch prevents the write data from being input to the write driver; and a determination circuit for determining whether the read system is normal or abnormal from the returned analog signal, the determination circuit comprising:
a circuit for obtaining an envelope curve of the returned analog signal; and
a comparison circuit for comparing the level of the obtained envelope curve with a predetermined reference value,
wherein it is determined from the comparison in the comparison circuit that the read system is abnormal when the level of the envelope curve is smaller than the reference value.

11. A method of verifying normality of a preamplifier circuit in a magnetic record regeneration apparatus having a write system which sends write currents corresponding to write data to a magnetic head performing writing and readout of data into and from a recording medium and a read system which receives readout currents of the magnetic head, the method comprising the steps of:
converting the write current from the write driver in the write system into a corresponding voltage;
converting the converted voltage into a full-wave rectified waveform;
holding a peak value of the converted full-wave rectified waveform;
outputting an average voltage of the converted full-wave rectified waveform; and
determining that the write system is abnormal based on the peak value and the average voltage.

* * * * *